United States Patent
Murata

(10) Patent No.: US 8,003,995 B2
(45) Date of Patent: Aug. 23, 2011

(54) SEMICONDUCTOR OPTICAL DEVICE WITH SUPPRESSED DOUBLE INJECTION PHENOMENON

(75) Inventor: Michio Murata, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 311 days.

(21) Appl. No.: 12/230,170

(22) Filed: Aug. 25, 2008

(65) Prior Publication Data

US 2009/0067460 A1    Mar. 12, 2009

(30) Foreign Application Priority Data

Aug. 31, 2007  (JP) .................................. 2007-226284

(51) Int. Cl.
*H01L 33/00* (2010.01)
(52) U.S. Cl. ................ 257/80; 257/81; 257/82; 438/22; 438/24
(58) Field of Classification Search .................... 257/80, 257/81, 82; 438/22, 24
See application file for complete search history.

(56) References Cited

U.S. PATENT DOCUMENTS

2005/0083979 A1* 4/2005 Leary et al. ..................... 372/43
2005/0253164 A1* 11/2005 Bhat et al. ...................... 257/104

FOREIGN PATENT DOCUMENTS

JP         05-183229        7/1993

OTHER PUBLICATIONS

N. Nishiyama et al, "High efficiency long wavelength VCSEL on InP grown by MOCVD", Electronics Letters, Mar. 6, 2003, vol. 39, No. 5.
Sekiguchi et al., "Long wavelength GaInAsP/InP Laser . . . Junction", Jpn. J. Appl. Phys., vol. 38, 1999, pp. L443-445.
Ortsiefer et al. "Low-resistance InGa(Al)As Tunnel Junctions for . . . Lasers", Jpn. J. Appl. Phys., vol. 39, 2000, pp. 1727-1729.

* cited by examiner

*Primary Examiner* — Bradley K Smith
*Assistant Examiner* — Marvin Payen
(74) *Attorney, Agent, or Firm* — Smith, Gambrell & Russell, LLP

(57) ABSTRACT

A semiconductor optical device where the leak current due to the double injection of carriers may be suppressed and a simplified process to form the device are disclosed. The device 10 provides, on the n-type InP substrate, a mesa and a burying region formed so as to bury the mesa. The mesa includes the first cladding layer, the active layer, the tunnel junction layer and the second cladding layer on the n-type InP substrate in this order. The tunnel junction layer comprises an n-type layer coming in contact with the active layer and a p-type layer between the active layer and the n-type layer. The n-type layer has a carrier concentration higher than that of the second cladding layer, while, the p-type layer may have the band gap energy greater than that of the second cladding layer.

9 Claims, 5 Drawing Sheets

SEMICONDUCTOR OPTICAL DEVICE WITH SUPPRESSED DOUBLE INJECTION PHENOMENON

BACKGROUND OF THE INVENTION

1. Field of the Invention

The present invention relates to a semiconductor optical device, in particular, the invention relates to a device that suppresses, what is called, the double injection phenomenon.

2. Related Prior Art

FIG. 5 illustrates a typical light-emitting device applicable in the optical communication system. The device 100 shown in FIG. 5 comprises, on an InP substrate 102, an n-type InP cladding layer 104, an InGaAsP active layer 106, a p-type InP cladding layer 108, and a p-type GaInAs contact layer 110, where the layer configuration is called as the double hetero (DH) structure. These semiconductor layers constitutes a mesa 112 extending along the primary surface of the substrate 102, and a semi-insulating InP 114 doped with iron (Fe) buries the mesa 112 in both sides thereof. On the InP 114 is formed with an insulating film 16. The electrode 118 comes in contact with the contact layer 110 within an opening 116a of the insulating film 116, while, the other electrode 120 is formed on the whole back surface of the InP substrate 102. Various prior arts, such as Japanese Patent application published as H05-183229A, have disclosed such a light emitting device.

The burying region 114 generally dopes iron (Fe) or ruthenium (Ru), which causes deep acceptor levels, and region 114 shows the semi-insulating characteristic by trapping electrons in these deep acceptor. However, in the device has a function of a laser diode (hereafter denoted as LD) shown in FIG. 5, the semi-insulating burying region 114 comes in physically contact with the p-type InP cladding layer 108. Because this p-type InP cladding layer 108 has substantial thickness to confine the light generating in the active layer 106, where the prior art mentioned above has a thickness of 1.5 μm for the p-type cladding layer, the contact area between the burying region 114 and the p-type cladding layer 108 becomes broader; accordingly, holes in the p-type cladding layer 108 easily diffuses into the burying region 114. Holes in the burying region 114 may recombine with the electrons trapped in the deep acceptors, which makes the acceptor levels vacant; and the electrons in the n-type cladding layer 104 moves into the burying region 114 and be trapped by vacant deep acceptors.

The mechanism explained above, which is called as the double injection phenomenon, causes the leak current in the LD to degrade the emission efficiency.

The prior art mentioned above forms an n-type layer between the p-type cladding layer 108 and the semi-insulating burying region 114 to trap holes from the p-type cladding layer 108. However, when this n-type layer comes in contact with the n-type cladding layer or the n-type substrate, electrons may flow in this n-type layer to the n-type cladding layer and the n-type substrate so as to bypass the active layer, which also increases the leak current and degrades the emission efficiency. Thus, such an n-type layer must be restricted in just sides of the p-type cladding layer, but the process to form such an n-type layer becomes quite hard.

SUMMARY OF THE INVENTION

A semiconductor optical device of the present invention has a feature that the device comprises an n-type semiconductor substrate, a mesa formed on the n-type substrate and a burying region that is doped with impurities causing a deep acceptor levels to trap electrons. The burying region is formed so as to bury the mesa. In the device of the invention, the mesa includes, on the n-type substrate, the first cladding layer with the n-type conduction, the active layer, the tunnel junction layer and the second cladding layer with the n-type conduction. The tunnel junction layer includes a p-type layer and an n-type layer stacked on the active layer in this order. The n-type layer has a carrier concentration higher than a carrier concentration of the second cladding layer.

The semiconductor optical device of the invention comprises the first and second cladding layers putting the active layer therebetween and each having the n-type conduction. Between the second cladding layer and the active layer is provided with the tunnel junction layer including the n-type layer and the p-type layer. When the optical device is biased so as to be positive in the second cladding layer with respect to the n-type substrate, the tunnel junction layer may generate the holes that are injected into the active layer and are recombined with electrons injected from the first cladding layer. Thus, the optical device of the invention may generate light even the first and second cladding layers are both n-type conduction. Moreover, the second cladding layer with the n-type conduction may effectively suppress the hole injection into the burying region, which drastically reduces the double injection phenomenon. Because the thickness of the p-type layer in the tunnel junction layer is far less than a thickness of the second cladding layer with the p-type conduction in the conventional device, the lead current due to the double injection from this p-type layer into the burying region may become extremely small.

The optical device of the invention has no structures to protect or cover the sides of the mesa, which is often provided in conventional devices to prevent the double injection phenomenon; accordingly, the optical device may be obtained by a quite simplified process.

The p-type layer in the tunnel junction layer may be AlGaInAs or AlAs each doped with carbon (C) whose band gap wavelength less than a band gap wavelength of the second cladding layer and have a thickness of 10 to 20 nm. The p-type layer may further have a doping concentration higher than the doping concentration of the second cladding layer.

DESCRIPTION OF PREFERRED EMBODIMENTS

Next, preferred embodiments of the present invention will be described as referring to drawings. In the description of the drawings, the same numerals or the symbols will refer to the same symbols without overlapping explanations.

Figure 1:
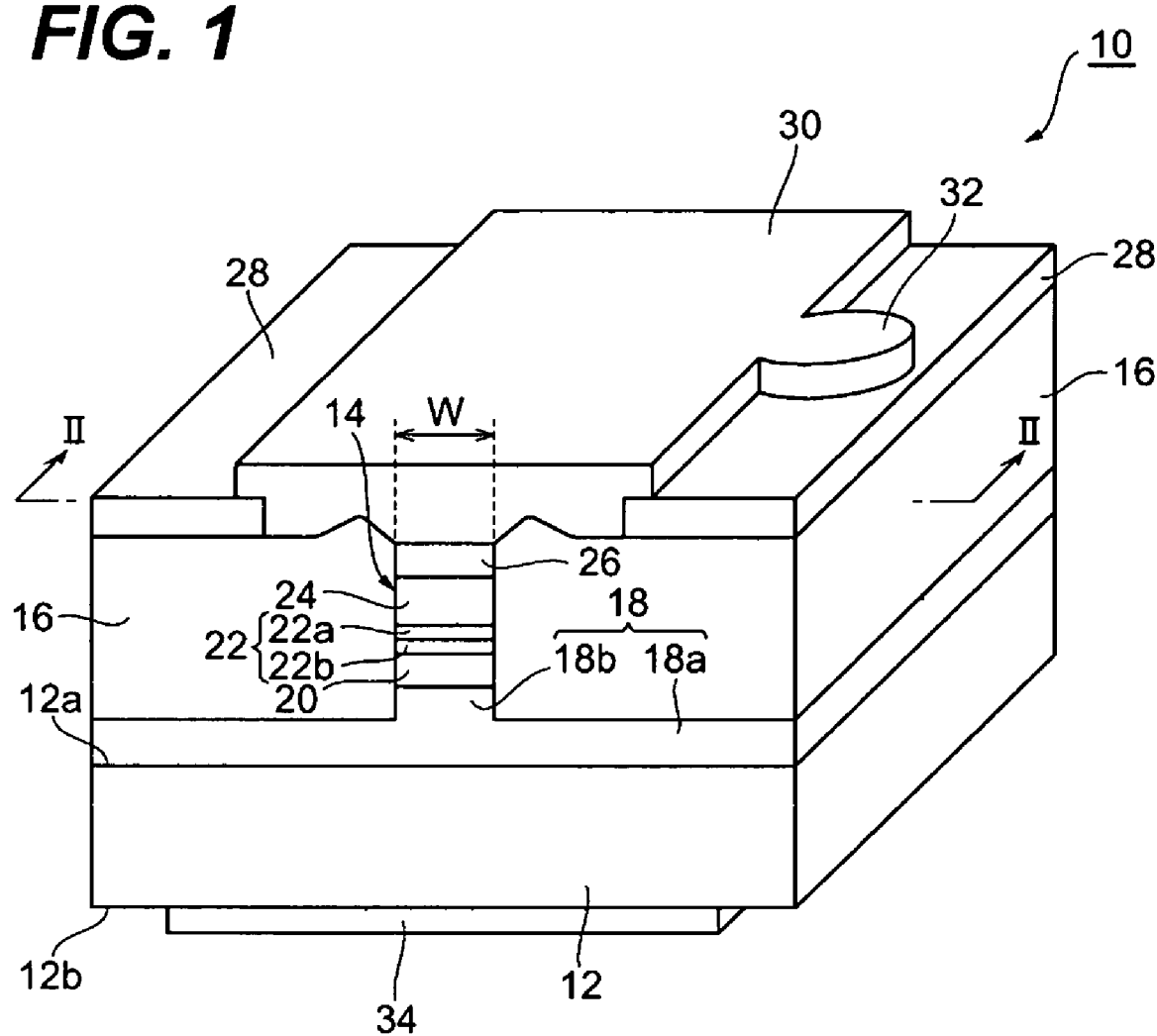
FIG. 1 is a perspective view of a semiconductor laser diode as an example of the present invention.
Figure 2:
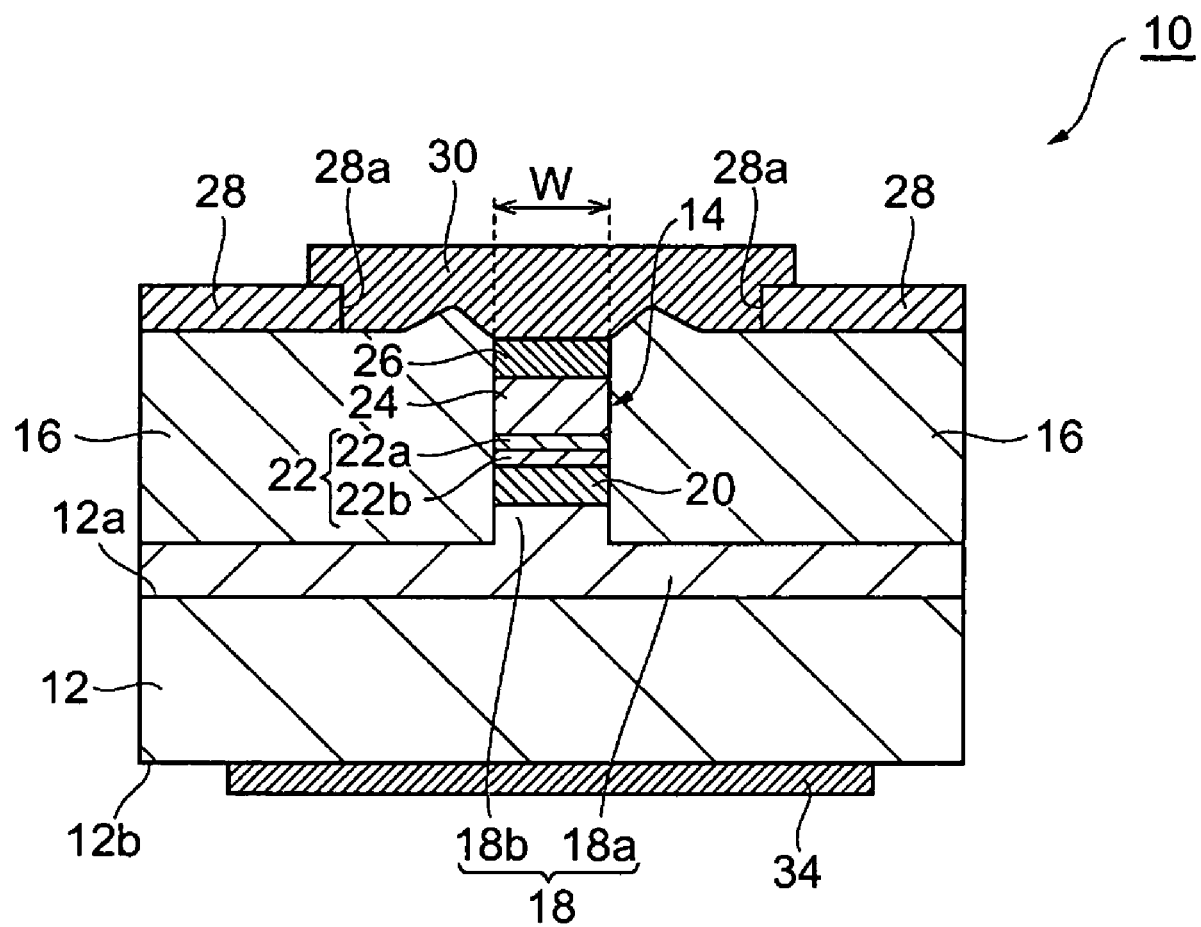
FIG. 2 is a cross section of the laser diode taken along the line II-II shown in FIG. 1.

FIG. 1 is a perspective view of a semiconductor laser diode (LD) 10 according to one embodiment of the present invention, while, FIG. 2 is a cross section of the LD 10 taken along the lint II-II shown in FIG. 1. The cross section shown in FIG. 2 is orthogonal to the direction of the light transmission.

The LD 10 includes a substrate 12, a mesa 14, and a burying region 16. The substrate 12 is made of n-type InP. The mesa 14, formed on the primary surface 12a of the substrate 12, extends along the light transmitting direction. The mesa 14 includes a portion 18b of a first cladding layer 18, an active layer 20, a tunnel junction layer 22, a second cladding layer 24, and an n-type contact layer 26. The mesa 14 has a width W of about 1.5 μm.

The first cladding layer 18 is made of n-type semiconductor material, for instance, the n-type InP doped with n-type impurities, such as silicon (Si), by a concentration of about $1 \times 10^{18}$ cm$^{-3}$ and has a thickness of about 0.5 μm. The first cladding layer 18 comprises a first portion 18a formed on a whole primary surface 12a of the InP substrate 12 and a second portion 18b formed on the first portion 18a and is involved within the mesa 14.

The second cladding layer 24, which is also made of n-type semiconductor material, puts the active layer 20 and the tunnel junction layer 22 between the first cladding layer 18. The second cladding layer 24 may be an n-type InP doped with Si by a concentration of about $1 \times 10^{18}$ cm$^{-3}$ and has a thickness of about 2.0 μm.

The active layer 20 may be also made of semiconductor material involved in the InP system. Here, the InP system means that the compound semiconductor material has a lattice constant matched with or substantially matched with that of InP. The active layer 20 may be a bulk layer, the single quantum well layer (SQW) or the multiple quantum well layers (MQW), in particular, the active layer 20 is preferable to be the stress induced MQW. As an embodiment, the active layer 20 includes a plurality of well layers made of GaInAsP and a plurality of barrier layers made of GaInAsP with a composition different from that of the well layer. The barrier layers and the well layers are alternately stacked to each other. The emission wavelength of the active layer 20, which corresponds to the band gap wavelength of the active layer, comes between 1.3 to 1.5 μm. Because the refractive index of the active layer 20 is greater than that of the first and second cladding layers, 18 and 24, these three layers, 18, 20 and 24, forms an optical waveguide.

The tunnel junction layer 22 is made of material involved in the InP system and has an n-type layer 22a and a p-type layer 22b.

The n-type layer 22a comes in contact with the second cladding layer 24. This n-type layer 22a dopes the n-type impurities such as Si by a concentration higher than that of the first cladding layer 18 and the second cladding layer 24. As an exemplary condition, the n-type layer 22a is GaInAsP doped with Si by a concentration of about $1 \times 10^{19}$ cm$^{-3}$ and has a thickness of 10 to 20 nm. The band gap wavelength of the n-type layer 22a may be larger than that of the second cladding layer 24, but preferably less than that of the emission wavelength of the LD 10, which is substantially equal to the band gap wavelength of the active layer 20, which effectively suppress the absorption of the light generated in the active layer 20 by this n-type layer 22a. As an exemplary condition, the band gap wavelength of the n-type layer 22a is 1.25 μm.

The p-type layer 22b, which is put between the active layer 20 and the n-type layer 22a, is doped with p-type impurities such as carbon (C) by a concentration higher than the doping concentration of the n-type impurities in the first cladding layer 18 and in the second cladding layer 24. The p-type layer 22b may be carbon doped AlGaInAs or carbon doped AlAs by a concentration of, for instance, $1 \times 10^{19}$ cm$^{-3}$ and having the band gap wavelength less than that of the second cladding layer 24, which may be made of InP. The thickness of the p-type layer 22b may be 10 to 20 nm and the band gap wavelength thereof may be, for instance, 0.8 μm.

The p-type impurities doped in the p-type layer 22b is not restricted to carbon (C). Zinc (Zn) or other impurities showing the p-type conduction may be applicable. The Zn atoms tend to inter-diffuse with impurities, for instance irons (Fe), doped in the burying region 16. This inter-diffusion may be suppressed by selecting the carbon as the p-type dopant in the p-type layer 22b. The carbon (C) effectively becomes the p-type dopant in semiconductor materials containing arsenic (As) such as AlGaInAs and AlAs.

The contact layer 26, provided on the second cladding layer 24, may be made of materials involved in the InP system and doped with n-type dopants such as Si. For example, the contact layer 26 may be GaInAs doped with Si by a concentration of about $1 \times 10^{19}$ cm$^{-3}$, and has a thickness of about 0.5 μm. The contact layer 26 shows the non-rectifier contact with respect to the electrode 30.

The burying region 16, which is the insulating region arranged on the primary surface 12a of the InP substrate 12 so as to bury the mesa 14, comes in contact with respective layers in the mesa 14. The burying region 16 may be made of InP doped with iron (Fe) or ruthenium (Ru), which causes the deep acceptor levels to trap electrons. Thus, the burying region 16 shows the semi-insulating characteristic to concentrate carriers provided in the LD 10 from the electrodes, 30 and 34, within the mesa 14 effectively. The dopant in the burying region 16 is not restricted to Fe or Ru, any impurities causing the deep traps may be applicable as the dopant in the burying region 16.

On the burying region 16 is provided with the insulating film 28 that may be made of inorganic material containing Si, such as silicon die-oxide (SiO$_2$). This insulating film 28 provides an opening 28a aligned with the mesa 14.

The LD 10 further provides the electrode 30 whose position is aligned with the mesa 14. The electrode 30 may be, for instance, a stacked metal of titanium (Ti), platinum (Pt) and gold (Au), and may be electrically coupled with the mesa 14 by coming in non-rectified contact with the contact layer 26. The electrode 30 is also connected with the pad 32 on the insulating film 28, which is shown in FIG. 1. An interconnection such as bonding wire is attached to the pad 32 to secure the electrical connection with the external circuit. The LD 10 provides another electrode 34 in the whole back surface 12b of the substrate 12. This electrode 34 may be made of eutectic metal of AuGe covered with gold (Au) to make the non-rectified contact with the InP substrate 12.

Next, a process to form the LD 10 shown in FIG. 1 will be described as referring to FIGS. 3 and 4, which are the cross section to show the process and corresponds to FIG. 2.

(Growing Semiconductor Films)

Figure 3A:
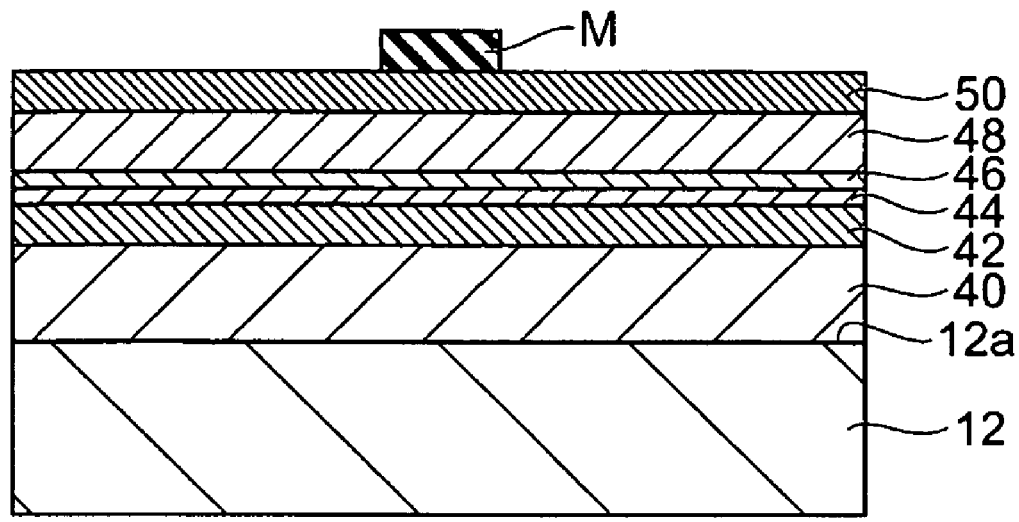
FIG. 3A illustrates the first process to form the laser diode.

The n-type InP substrate is firstly prepared. On the primary surface 12a of the substrate 12 is grown with an n-type InP film 40 for the first cladding layer 18, a multiple stacked films 42 for the active layer 20 including GaInAsP film for the well layers and another GaInAsP film with a different composition for the barrier layers, a p-type AlGaInAs film 44 for the p-type layer 22b of the tunnel junction layer 22, an n-type GaInAsP film 46 for the n-type layer 22a of the tunnel junction layer 22, an n-type InP film 48 for the second cladding layer 24, and an n-type GaInAs film 50 for the contact layer 26, as illustrated in FIG. 3A. The metal organic chemical vapor deposition (MOCVD) technique may epitaxially grow these films, 40 to 50. The n-type films, 40, 46, 48 and 50 may be doped with silicon (Si) by using silane (SiH$_4$) as a source gas, while, the p-type film 44 may be doped with carbon (C) by using carbon bromide (CBr$_4$) as a source gas.

(Formation of Mesa)

Figure 3B:
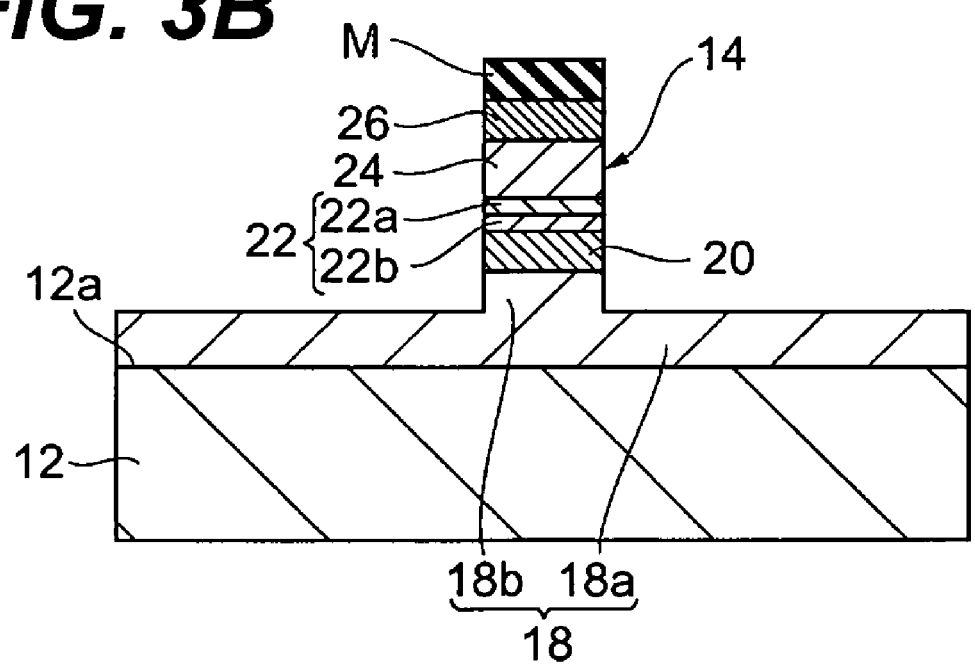
FIG. 3B shows the second process subsequent to that shown in FIG. 3A.

Next, on the n-type GaInAs film 50 is formed with a mask M whose longitudinal direction is aligned with the light transmitting direction (FIG. 3A). The mask M may be made of inorganic material such as silicon die-oxide (SiO$_2$) and has a width of, orthogonal to the transmitting direction, about 1.5 μm. The dry etching technique, such as the reactive ion etching (RIE), may remove a portion of the films, 40 to 50, not covered with the mask M, as shown in FIG. 3B. In the process, the etching may be stopped before the n-type InP substrate 12 exposes, that is, the etching is stopped in the halfway of the n-type InP film 40, which forms the first cladding layer 18 including the first portion 18a and the second portion 18b, and the mesa 14 including the second portion 18b, the active layer 20, the tunnel junction layer 22, which includes the n-type 22a and p-type 22b layers, the second cladding layer 24 and the contact layer 26.

(Formation of Burying Region)

Figure 4A:
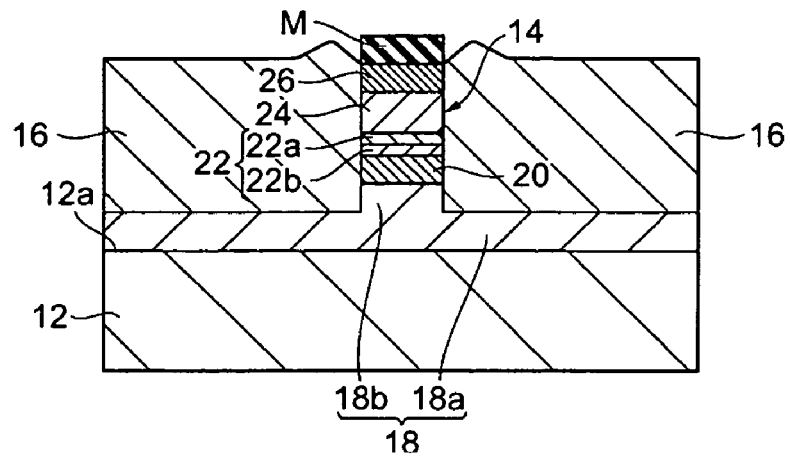
FIGS. 4A to 4C each illustrates the process of the laser diode subsequent to that shown in FIG. 3B.

Next, the process grows the burying region 16 in both sides of the mesa 14 as leaving the mask M so as to bury the mesa 14. An iron-doped InP or a ruthenium-doped InP may be epitaxially grown by the MOCVD technique to form the burying region 16 (FIG. 4A). The iron-doped InP may be grown by using ferrocene ($C_{10}H_{10}Fe$) as a dopant gas.

(Subsequent Process)

Figure 4B:
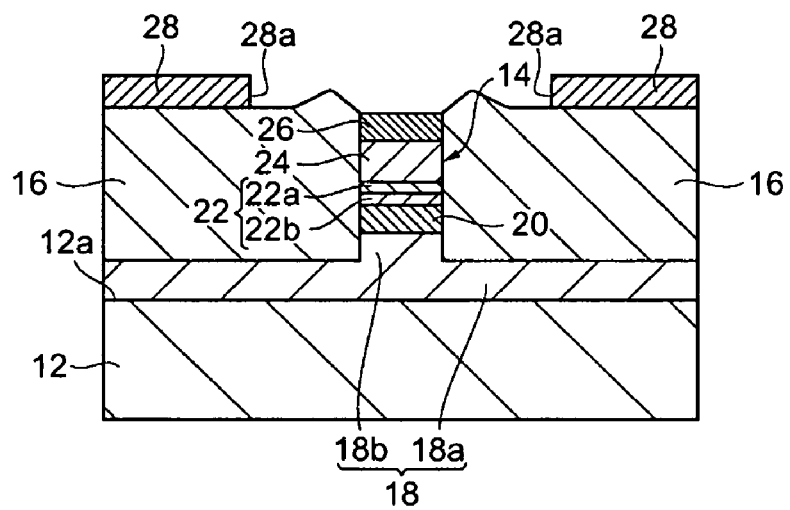
Figure 4C:
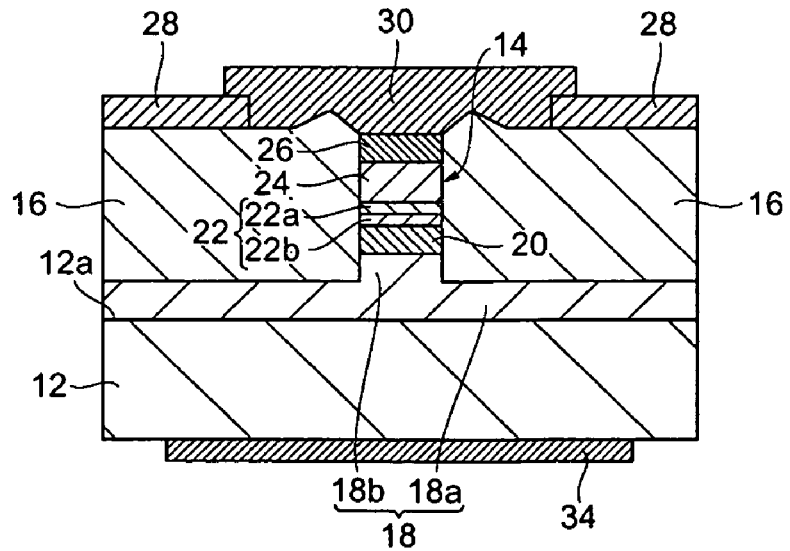

Subsequently, the process forms the insulating film 28 with the opening 28a as illustrated in FIG. 4B. That is, removing the mask M shown in FIG. 4A, the insulating film 28 made of inorganic material of silicon die-oxide ($SiO_2$) is formed on the mesa 14 and on the burying region 16. Etching a portion of the insulating film 28 to form the opening 28a on the mesa 14, the contact layer 26 is exposed within the opening 28a. The stacked meal 30 made of Ti/Pt/Au and another metal 34 made of AuGe/Ni are formed on top and back surfaces of the device, respectively, as illustrate in FIG. 4C. Finally, cleaving thus processed device at a surface orthogonal to the longitudinal direction of the mesa 14, the LD 10 shown in FIGS. 1 and 2 may be completed.

In the LD 10 thus processed, applying a bias between two electrodes, 30 and 34, so as to become positive at the electrode 30, holes are generated in the tunnel junction layer 20. These holes are injected into the active layer 20 to generate light by recombining thereat with electrons injected from the first cladding layer 18. Thus, by providing the tunnel junction layer 22 between the second cladding layer 24 and the active layer 20, the active layer 20 may effectively bring the ability to generate light even the first and the second cladding layers, 18 and 24, are both n-type conduction.

Figure 5:
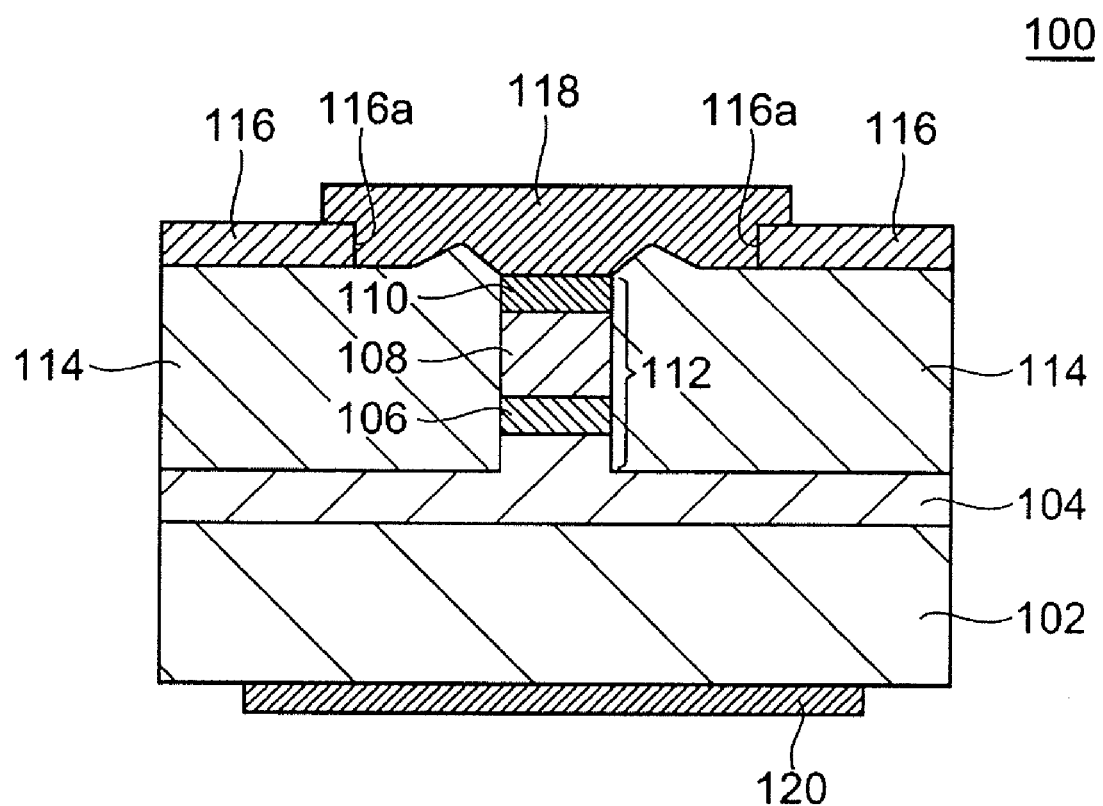
FIG. 5 is a cross section of a conventional optical device.

Because the second cladding layer 24 is then-type conduction, which is a feature of the present device and may be explicitly distinguished from the conventional configuration shown in FIG. 5, the hole injection cannot occur from the second cladding layer 24 to the burying region 16. Moreover, the thickness of the p-type layer 22b in the tunnel junction layer 22 may be thin enough, which is 10 to 20 nm in the embodiment explained above, compared with the conventional second cladding layer 24 whose thickness is typically around 2.0 μm; accordingly, the leak current due to the double injection between the p-type layer 22b and the burying region 16 may become far small compared with the conventional device providing the p-type cladding layer.

The LD 10 of the present embodiment may be processed such that a stack of films, 40 to 50, are firstly grown, a mesa 14 is formed by the etching, and the burying region 16 is finally formed so as to bury the mesa 14. Accordingly, the LD 10 may be easily processed compared to the conventional device that provides the additional structure in both sides of the mesa to prevent the hole injection from the p-type cladding layer into the burying region.

While the preferred embodiments of the present invention have been described in detail above, many changes to these embodiments may be made without departing from the true scope and teachings of the present invention. For instance, although the embodiment above concentrates on the semiconductor laser diode, the invention may be applicable to the semiconductor modulator, the semiconductor device integrating the laser diode with the modulator, or the semiconductor multiplexer/de-multiplexer.

Moreover, although the embodiment provides the tunnel junction layer on the active layer, the invention may further provide another p-type layer between the active layer and the tunnel junction layer. In this case, the additional p-type layer may have a thickness enough thinner than that of the conventional p-type cladding layer to reduce the leak current by the double injection phenomenon. Such an additional p-type layer may have a refractive index so as to compensate the asymmetry of the distribution of the refractive index due to the existing of the tunnel junction layer. The present invention, therefore, is limited only as claimed below and the equivalents thereof.

What is claimed is:

1. A semiconductor optical device, comprising:
   an n-type semiconductor substrate;
   a mesa formed on said n-type semiconductor substrate; and
   a burying region made of InP and doped with at least one of iron (Fe) and ruthenium (Ru) for trapping electrons, said burying region burying said mesa,
   wherein said mesa including a first cladding layer with an n-type conduction and provided on said n-type semiconductor substrate, an active layer provided on said first cladding layer, a tunnel junction layer provided on said active layer, and a second cladding layer with said n-type conduction, said second cladding layer being provided on said tunnel junction layer,
   wherein said tunnel junction layer including a p-type layer and an n-type layer stacked on said active layer in this order, said n-type layer having a carrier concentration higher than a carrier concentration of said second cladding layer, said p-type layer having a thickness of 10 to 20 nm, and
   wherein said burying region comes into contact with no p-type layers except for said p-type layer of said tunnel junction layer within said mesa.

2. The semiconductor optical device according to claim 1, wherein said carrier concentration of said n-type layer in said tunnel junction layer is higher than a carrier concentration of said first cladding layer.

3. The semiconductor optical device according to claim 1, wherein said n-type layer in said tunnel junction layer has a band gap wavelength longer than a band gap wavelength of said second cladding layer.

4. The semiconductor optical device according to claim 1, wherein said n-type layer in said tunnel junction layer has a band gap wavelength less than a band gap wavelength of said active layer.

5. The semiconductor optical device according to claim 1, wherein said n-type layer in said tunnel junction layer is made of GaInAsP doped with silicon (Si).

6. The semiconductor optical device according to claim 1, wherein said p-type layer in said tunnel junction layer is doped with carbon (C).

7. The semiconductor optical device according to claim 1, wherein said p-type layer in said tunnel junction layer has a doping concentration higher than a doping concentration of said second cladding layer.

8. The semiconductor optical device according to claim 7, wherein said p-type layer in said tunnel junction layer has a band gap wavelength less than a band gap wavelength of said second cladding layer.

9. The semiconductor optical device according to claim 7, wherein said p-type layer in said tunnel junction layer is made of one of AlGaInAs or AlAs doped with carbon (C).

* * * * *